United States Patent [19]

Gemma et al.

[11] 4,420,696
[45] Dec. 13, 1983

[54] PULSE TRAIN PRODUCING APPARATUS

[75] Inventors: Kazutoshi Gemma, Sagamihara; Noriaki Hashimoto, Hadano, both of Japan

[73] Assignee: Hitachi, Ltd., Tokyo, Japan

[21] Appl. No.: 238,039

[22] Filed: Feb. 25, 1981

[30] Foreign Application Priority Data

Feb. 25, 1980 [JP] Japan .................. 55/22600

[51] Int. Cl.³ .................. H03K 5/15; H03K 19/21
[52] U.S. Cl. .................. 307/262; 307/269; 307/480; 328/61; 328/62
[58] Field of Search .................. 307/262, 269, 480; 328/61, 62

[56] References Cited

U.S. PATENT DOCUMENTS 3,911,368 10/1975 Tarczy-Hornoch .................. 307/262
3,993,957 11/1976 Davenport .................. 307/480
4,034,303 7/1977 Kodaira .................. 307/480

Primary Examiner—John S. Heyman
Attorney, Agent, or Firm—Antonelli, Terry & Wands

[57] ABSTRACT

A pulse train producing apparatus is arranged such that a plurality of first pulse trains are produced correspondingly to a plurality of second pulse trains to be produced so that the leading or trailing edges of the pulses of each first train are adjusted in phase according to the intended phases of corresponding edges of the pulses of a corresponding one of the second pulse trains and the pulses of each first train overlap at their leading or trailing edge portions with the trailing or leading edge portions of a different one of the first trains and two of the first pulse trains having the overlapping portions are applied for cutting away the overlapping portions of the pulses of one of the two pulse trains.

14 Claims, 14 Drawing Figures

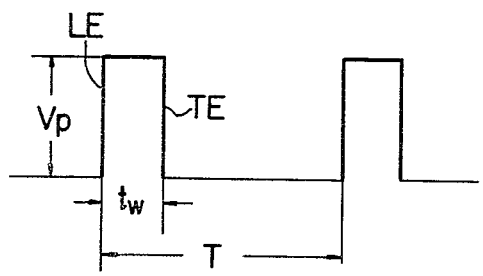
FIG. 1
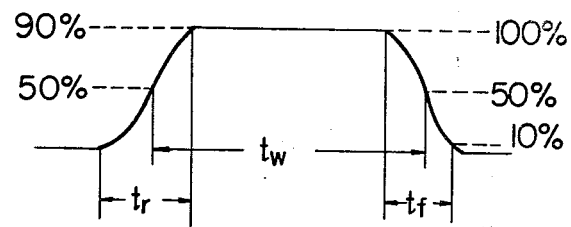
FIG. 2
FIG. 3
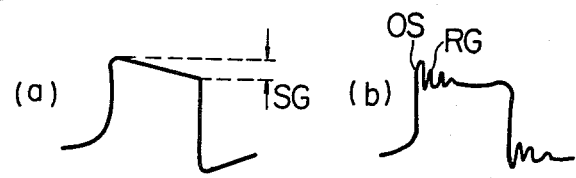
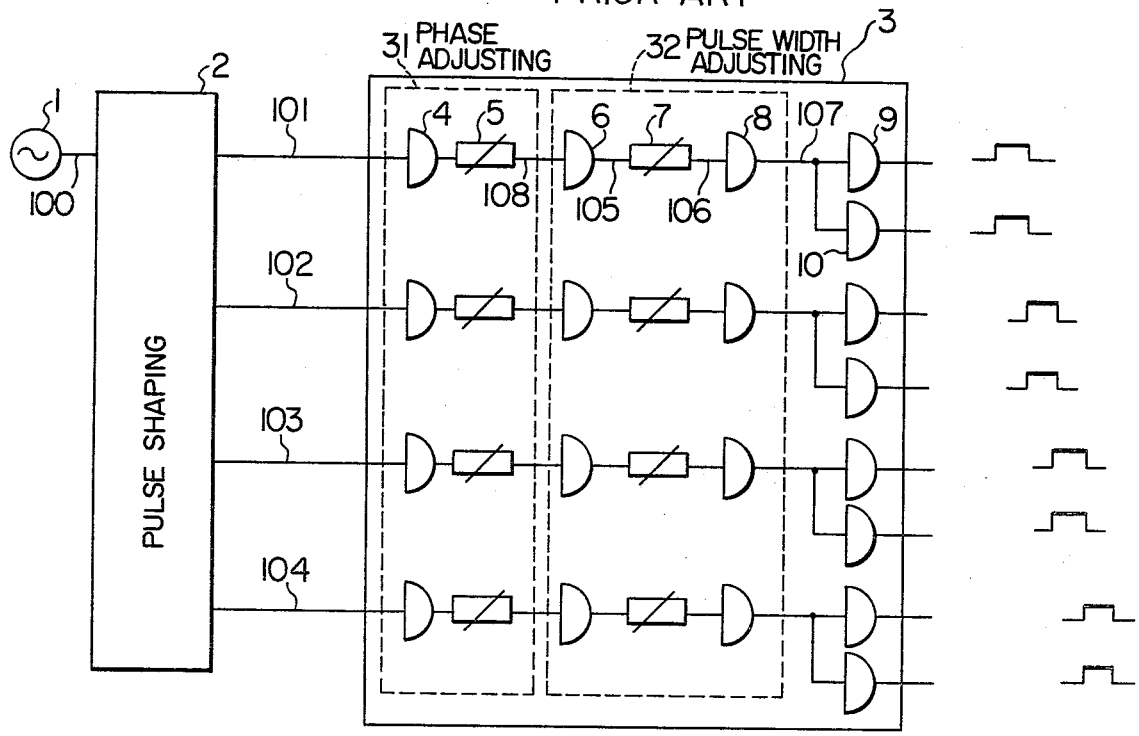
FIG. 4 PRIOR ART

PULSE TRAIN PRODUCING APPARATUS

BACKGROUND OF THE INVENTION

This invention relates to a pulse train producing apparatus which generates a plurality of pulse trains of phases different from one another and supplies such pulse trains to various parts of a processing apparatus such as an information processor.

A pulse having a basic signal waveform or rectangular waveform as shown in FIG. 1 is generally used as such a clock pulse. Referring to FIG. 1, the rising and falling waveform portions of the pulse are designated by LE (leading edge) and TE (trailing edge) respectively, and the peak value of the waveform portion between the leading and trailing edges LE and TE represents the amplitude Vp of the pulse. The duty ratio D is an important parameter indicative of the quantity of effective energy of a pulse signal as shown in FIG. 1. This duty ratio D is given by $$D = (t_w/T) \times 100 (\%) \qquad (1)$$

where $t_w$ is the pulse width, and T is the pulse interval.

However, an actual rectangular pulse is not exactly rectangular in shape and includes sloped skirt portions in both the leading and trailing edges, as shown in FIG. 2. In the pulse waveform shown in FIG. 2, the period of time required for the pulse waveform to rise up to 90% of the amplitude from the zero level is called the rise time $t_r$, the period of time required for the pulse waveform to fall down to 10% of the amplitude from the 100% level is called the fall time $t_f$, and the period of time between 50% of the amplitude on the leading edge and 50% of the amplitude on the trailing edge is called the pulse width $t_w$.

Further, a sag SG, a overshoot OS, a ringing RG, etc. may sometimes occur on a rectangular pulse as shown in (a) and (b) of FIG. 3. The sag SG occurs when the low-frequency characteristic of the circuit is not good or when a capacitive coupling, a pulse transformer or the like is present in the circuit. The ringing RG is caused by an inductance component present in the circuit and frequently affects undesirably against the process.

In an information processor requiring highspeed information processing, referred to merely as processor hereinafter, a plurality of clock pulse groups or trains different in phase from one another are generally used to proceed processing of the processor as changing the signalling states of internal registers, flip-flop and the like. Clock pulses supplied to such a processor are required to be quite accurate in their phase and pulse width. Therefore, with the increase in the processing speed of such a processor, the phase and pulse width of the clock pulses must be more strictly controlled.

In a processor designed to operate at a high speed, an oscillator, for example, a crystal oscillator capable of oscillation with least fluctuation in its oscillation frequency is used as a clock pulse generator, and the clock pulses generated from the crystal oscillator are then finely adjusted in their phase and pulse width before being distributed to various logic operation parts of the processor.

FIG. 4 is a block diagram of a prior art clock pulse producing apparatus, FIG. 5 is a time chart of the clock pulses produced by the apparatus shown in FIG. 4, and FIG. 6 shows the structure of the pulse width adjusting circuit in the apparatus shown in FIG. 4.

In the apparatus shown in FIG. 4, the oscillation output from a crystal oscillator 1 is applied to a pulse shaping unit 2 to be shaped into rectangular clock pulses so that clock pulses having phases determined depending on the function of a processor can be supplied to the processor. FIG. 4 shows that four kinds of clock pulse different in phase from one another appear on respective output lines 101 to 104 of the pulse shaping unit 2.

The clock pulses appearing on the output lines 101, 102, 103 and 104 shown in FIG. 4 are designated by $a_0$, $a_1$, $a_2$ and $a_3$ respectively in FIG. 5. Referring to FIG. 5, one machine cycle T is equally divided into four phases $T_0$, $T_1$, $T_2$ and $T_3$ to which the clock pulses $a_0$, $a_1$, $a_2$ and $a_3$ are allotted respectively so that the four kinds of clock pulses turn on at the phases $T_0$, $T_1$, $T_2$ and $T_3$ respectively. The pulse width of each of these clock pulses $a_0$ to $a_3$ is $\frac{1}{4}$ T.

Although the clock pulses $a_0$ to $a_3$ shown in FIG. 5 have already been roughly or finely adjusted in their phase and pulse width in the pulse shaping unit 2, there is also a pulse shaping unit in which no adjustment is applied to the phase and pulse width.

Returning to FIG. 4, the clock pulses appearing on the output lines 101 to 104 of the pulse shaping unit 2 are applied to a clock distributor unit 3 in which, regardless of whether or not the clock pulses have been adjusted in their phase and pulse width in the pulse shaping unit 2, the clock pulses are finally finely adjusted in their phase and pulse width in a phase adjusting section 31 and a pulse width adjusting section 32 before being distributed to a plurality of logic operation parts of the processor. The operation of the clock distributor unit 3 will be described in more detail by reference to one of the clock pulses, for example, the clock pulse $a_0$. The clock pulse $a_0$ appearing on the output line 101 of the pulse shaping unit 2 is applied through an amplifier gate 4 to a phase adjusting circuit 5 in the phase adjusting section 31. After having been adjusted in its phase in the phase adjusting circuit 5 in the phase adjusting section 31, the clock pulse $a_0$ is applied by way of an output line 108 to an amplifier gate 6 in the pulse width adjusting section 32. The clock pulse $a_0$ is then applied by way of an output line 105 to a pulse width adjusting circuit 7 in the pulse width adjusting section 32 to be finely adjusted in its pulse width. The clock pulse $a_0$ having been thus adjusted in both the phase and the pulse width passes through another amplifier gate 8 in the pulse width adjusting section 32 to be applied by way of an output line 107 to source gates 9 and 10 provided for supplying the clock pulse $a_0$ to the associated logic operation part of the processor.

It is to be added herein that the number of amplifier gates or source gates is not always fixed because it is dependent upon the factors including the electrical characteristics of the transmission circuit system of the processor and the physical distances upto the logic operation parts supplied with the clock pulses.

There are two reasons why the phase and pulse width of the clock pulses must finally be finely adjusted in the clock distributor unit 3. In the first place, the phase and pulse width of the clock pulses being transmitted by way of the output lines 101 to 104 to the clock distributor unit 3 tend to deviate from the settings due to the physical or electrical characteristics of the transmission lines. Secondly, it is impractical to finally finely adjust the phase and pulse width of the individual clock pulses at the respective associated logic operation parts of the processor after they have been supplied from the clock distributor unit 3.

There are various methods of phase adjustment in the phase adjusting circuits 5 in the phase adjusting section 31 shown in FIG. 4. For example, independently adjustable delay lines may be connected in series with the individual clock pulse lines of different phases respectively.

Also, there are various methods of pulse width adjustment in the pulse width adjusting circuits 7 in the pulse width adjusting section 32 shown in FIG. 4. For example, a combination of an AND gate 11, a delay line 12 and an inverter 13 as shown in FIG. 6 may be used.

FIG. 6 shows the structure of one form of the pulse width adjusting circuit 7 which makes fine adjustment of the pulse width to readjust it to the value of $\frac{1}{4}$ T when the pulse width shown in FIG. 5 exceeds the value of $\frac{1}{4}$ T. Referring to FIG. 6, the clock pulse having been adjusted in its phase is applied by way of the output line 105 to one of the input terminals of the AND gate 11 and also to the delay line 12. After being delayed by a delay time t in the delay line 12, the clock pulse is applied through the inverter 13 to the other input terminal of the AND gate 11 by way of an input line 107. Thus, when the delay time t is set at $t=\frac{1}{4}$ T, the trailing edge portion of the clock pulse is cut away at the position of $\frac{1}{4}$ T from the leading edge which is taken as the reference position, so that the pulse width can be adjusted to be $\frac{1}{4}$ T.

When, on the other hand, the circuit system is such that the pulse width will become shorter than $\frac{1}{4}$ T in the course of clock pulse transmission to the clock distributor unit 3, the inverter 13 in the circuit shown in FIG. 6 may be eliminated, and the AND gate 11 may be replaced by an OR gate so that the pulse width of the clock pulse applied by way of the line 105 may be extended by the time t. In such a case, the time t of the delay line 12 may be set to compensate for the decrement of the pulse width during clock pulse transmission.

When such a prior art clock distributor unit 3 is incorporated in processors to distribute clock pulses, the phase adjusting circuits 5 and the pulse width adjusting circuits 7 thereof must be regulated at a suitable time of the manufacturing process for each individual processor. Especially, in this case, the regulation of the pulse width adjusting circuits 7 is encountered with problems.

One of the problems is attributable to the fact that the clock pulses applied to the clock distributor unit 3 inevitably fluctuate in width arround its designed setting. Therefore, an adjusting function for increasing the pulse width and an adjusting function for decreasing the pulse width are both required, and, for the realization of these two functions, the circuit structure of the pulse width adjusting circuits 7 shown in FIG. 4 will become extremely complex. It is another problem that the possible difference in accuracy among the respective pulse width adjusting circuits 7 makes it further difficult to precisely control the pulse width.

As one of the measures for solving the above problems, it has been proposed to previously adjust the pulse width in the pulse shaping unit 2 in such a manner that the pulse width tends to normally decrease or increase relative to the designed setting within a limited range. In such a case too, delay time values t peculiar to individual processors must be separately determined, and a lot of man-hours are required for the purpose of regulation of the pulse width adjusting circuits 7.

SUMMARY OF THE INVENTION

It is therefore a primary object of the present invention to provide a novel and improved pulse producing apparatus which obviates such prior art problems, in which the pulse width can be set at the designed setting with high accuracy without substantially increasing the number of hardware elements, and which eliminates the necessity of work for calibration of the pulse width adjusting circuits during the manufacturing process for each individual processor.

The pulse producing apparatus according to the present invention has features in that the leading or trailing edge of each pulse of one phase is defined by the trailing or leading edge of a corresponding pulse of another phase, thereby obtaining pulses having a predetermined pulse width. More precisely, according to the present invention, when a group of pulses having been adjusted in the phase of the leading edge are applied, the trailing edge portion of each of pulses in a preceding group is cut away by the leading edge of the corresponding one of the former pulses, while when a group of pulses having been adjusted in the phase of the trailing edge are applied, the leading edge portion of each of pulses in a succeeding group is cut away by the trailing edge of the corresponding one of the former pulses, so that pulses having a highly accurate pulse width can be obtained.

The present invention is advantageous in that the structure of the apparatus can be simplified, and any regulation of the pulse width adjusting circuits is unnecessary, thereby reducing the manufacturing costs of processors in which the pulse producing apparatus of the present invention is incorporated.

BRIEF DESCRIPTION OF THE DRAWINGS

FIG. 1 illustrates the basic waveform of a rectangular pulse.

FIGS. 2 and 3 illustrate actual waveforms of such a rectangular pulse.

FIG. 4 is a block diagram of a prior art pulse producing apparatus.

DESCRIPTION OF THE PREFERRED EMBODIMENTS

Preferred embodiments of the present invention will now be described in detail with reference to the drawings.

Figure 5:
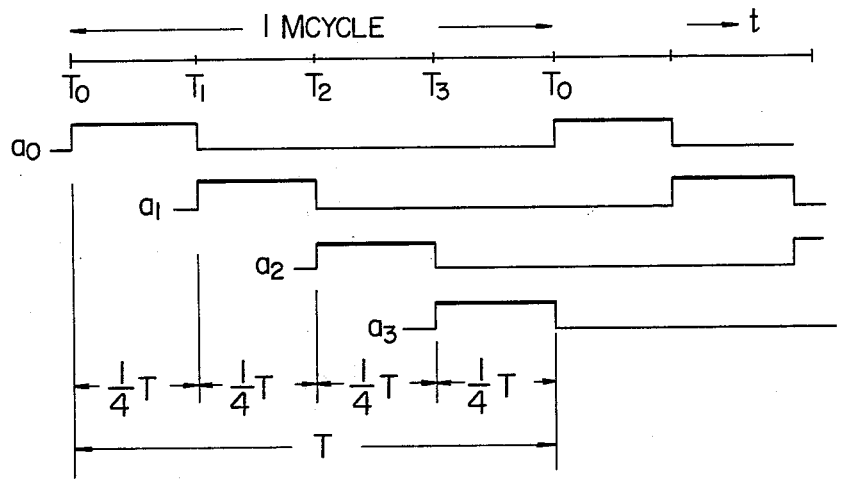
FIG. 5 shows input waveforms applied to the apparatus shown in FIG. 4.
Figure 6:
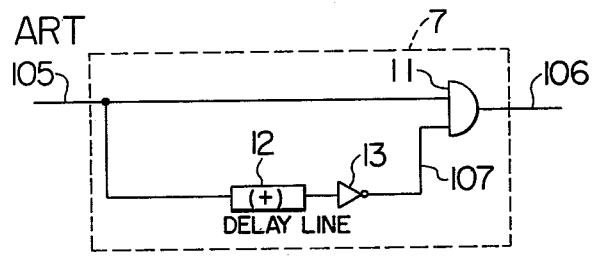
FIG. 6 shows the structure of one form of the pulse width adjusting circuit in the apparatus shown in FIG. 4.
Figure 7:
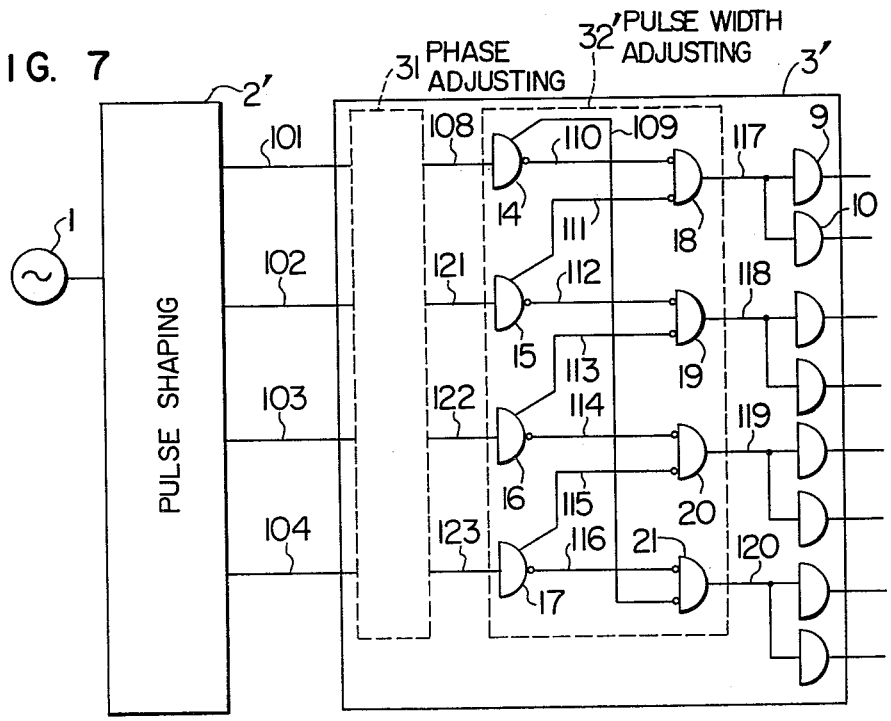
FIG. 7 is a block diagram of an embodiment of the pulse producing apparatus according to the present invention.

FIG. 7 is a block diagram of an embodiment of the clock pulse producing apparatus according to the present invention. In FIG. 7, there are shown a crystal oscillator 1, a pulse shaping unit 2' and a clock distributor unit 3'. The pulse shaping unit 2' and the clock distributor unit 3' include the respective necessary elements for all the phases in a manner similar to the case of the prior art ones shown in FIG. 4, and the former is similarly connected to the latter by a plurality of output lines 101 to 104. The pulse shaping unit 2' and the clock distributor unit 3' are the same as those shown in FIG. 4 except a pulse width adjusting section 32' of the clock distributor unit 3'.

The clock distributor unit 3' includes a phase adjusting section 31, a group of source gates and a pulse width adjusting section 32' which represents an important feature of the present invention. The pulse width adjusting section 32' includes gates 14 to 17 and NAND gates 18 to 21 corresponding to clock pulses of individual phases respectively. The gates 14, 15, 16 and 17 are connected to output lines 108, 121, 122 and 123 of the phase adjusting section 31 respectively, and each of these gates 14 to 17 produces a non-inverted output and an inverted output in response to the application of a clock pulse by way of the associated output line of the phase adjusting section 31. The gates 14, 15, 16 and 17 have output lines 109, 110; 111, 112; 113, 114; and 115, 116 respectively. The NAND gates 18, 19, 20 and 21 are connected to the gate output lines 110, 111; 112, 113; 114, 115; and 116 109 respectively. That is, each of the NAND gates 18 to 21 receives an inverted output from the gate of the same or own phase and a non-inverted output from the gate of phase delayed by one phase relative to the own phase. In the circuit shown in FIG. 7, the electrical connections are such that a clock pulse of logic level "1" appears on an output line of one of the NAND gates 18 to 21 only when another clock pulse applied by way of the input line of phase delayed by one phase relative to that of the input line of the former has a logic level "0". For example, a signal applied by way of the input line 108 of the gate 14 appears on an output line 117 of the NAND gate 18 when a "0" appears on the output line 111 of the next adjacent gate 15, that is, when a "0" is applied to the gate 15 by way of its input line 121.

Figure 8:
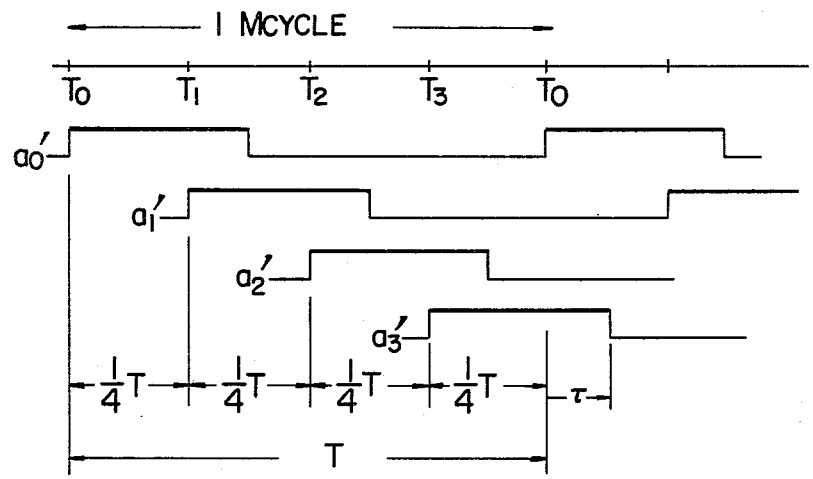
FIGS. 8 and 11 show waveforms of inputs to and outputs from the pulse width adjusting section in the apparatus shown in FIG. 7 respectively.

The operation of the pulse width adjusting section 32' in the apparatus shown in FIG. 7 will be described with reference to a case in which clock pulses $a_0'$, $a_1'$, $a_2'$ and $a_3'$ as shown in FIG. 8 are applied thereto. It is supposed that the clock pulses $a_0'$, $a_1'$, $a_2'$ and $a_3'$ shown in FIG. 8 are applied by way of the input lines 108, 121, 122 and 123 respectively of the pulse width adjusting section 32' shown in FIG. 7, and the leading edges of the individual clock pulses $a_0'$ to $a_3'$ are adjusted to coincide with the respective phases $T_0$ to $T_3$ spaced apart by $\frac{1}{4}$ T from each other. It is supposed further that the pulse width of each of these pulses $a_0'$ to $a_3'$ has previously been set in the pulse shaping unit 2' to be ($\frac{1}{4}$ T + $\tau$) longer than $\frac{1}{4}$ T. The value $\tau$ is determined taking into account possible deviations or variations of the pulse width due to fluctuations of the circuit characteristics. Such a pulse shaping unit 2' can be easily constructed according to the prior art technique.

Figure 9:
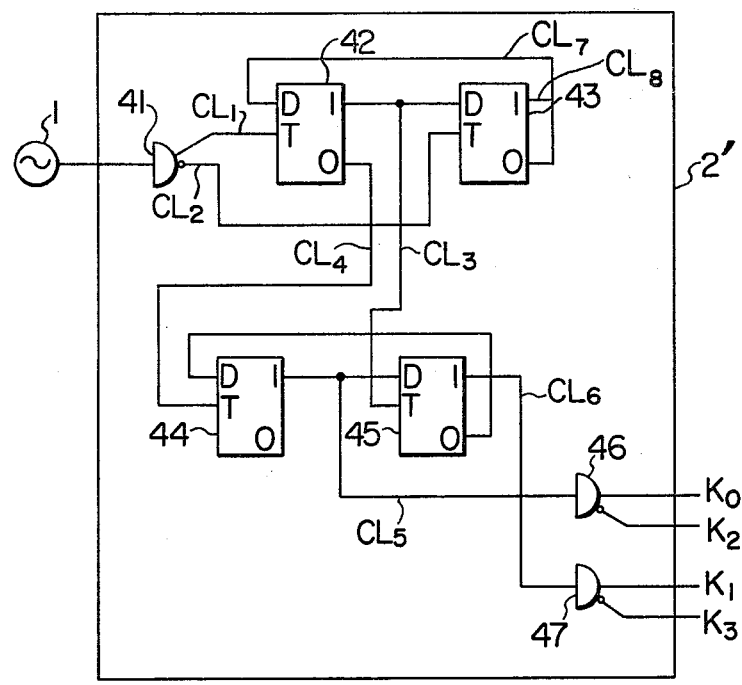
FIG. 9 shows in detail the structure of one form of the pulse shaping unit in the apparatus shown in FIG. 7.
Figure 10:
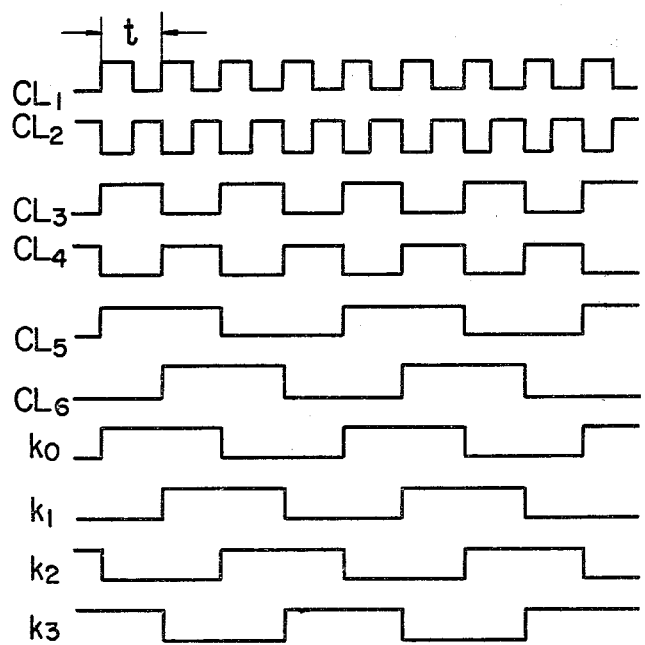
FIG. 10 shows signal waveforms appearing at various parts in FIG. 9.

FIG. 9 shows the structure of one form of the pulse shaping unit 2' which produces a group of clock pulses in which $\tau \tau$ is "t", and FIG. 10 shows signal waveforms appearing at various parts in FIG. 9.

Referring to FIG. 9, an oscillator 1 generates a periodic signal having a period of t. The oscillation output from the oscillator 1 is applied as an input to a gate 41 which produces a non-inverted output $CL_1$ and an inverted output $CL_2$ in response to the application of the input. Reference numerals 42 to 45 designate edge-triggered flip-flops (which will be abbreviated hereinafter as FF's). Each of these FF's receives an input signal applied to its D terminal during the rise time of a signal applied to its T terminal. Reference numerals 46 and 47 designate gates which produce a non-inverted output and an inverted output when an input is applied from the "1" output terminal of the FF's 44 and 45 respectively. The combined circuit of the FF's 42 and 43 has a function of dividing the frequency of the oscillation output of the oscillator 1 by the factor of two, and a non-inverted output $CL_3$ and an inverted output $CL_4$ each having such a doubled period as shown in FIG. 10 appear from the "1" and "0" output terminals respectively of the FF 42. The pulse width of these signals $CL_3$ and $CL_4$ is therefore t. The combined circuit of the FF's 44 and 45 has a function of further dividing the frequency of the doubled period signals $CL_3$ and $CL_4$ by the factor of two, and signals $CL_5$ and $CL_6$ each having such a quadroupled period as shown in FIG. 10 appear from the "1" output terminals of the FF's 44 and 45 respectively. These signals $CL_5$ and $CL_6$ are out of phase by t relative to each other, and the pulse width of these signals $CL_5$ and $CL_6$ is 2t as shown in FIG. 10. The signal $CL_5$ is then applied to the gate 46 to appear as a non-inverted output $k_0$ and an inverted output $k_2$ therefrom, while the signal $CL_6$ is applied to the gate 47 to appear as a non-inverted output $k_1$ and an inverted output $k_3$ therefrom.

The clock pulses $K_0$, $K_1$, $K_2$, and $K_3$ thus obtained are applied from the pulse shaping unit 2' to the clock distributor unit 3' by way of the respective output lines 101 to 104 shown in FIG. 7. During transmission to the clock distributor unit 3', the phase and pulse width of these clock pulses are subject to variations. Therefore, the leading edges of the clock pulses $K_0$, $K_1$, $K_2$, and $K_3$ are adjusted to coincide with the positions $T_0$, $T_1$, $T_2$ and $T_3$ respectively in the phase adjusting section 31 of the clock distributor unit 3', so as to obtain clock pulses $a_0'$, $a_1'$, $a_2'$ and $a_3'$ as shown in FIG. 8.

Figure 11:
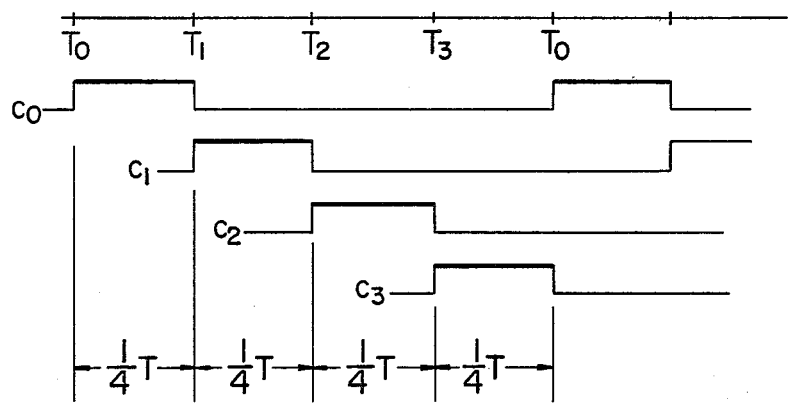

The clock pulses $a_0'$ to $a_3'$ shown in FIG. 8 are then applied to the pulse width adjusting section 32'. In the pulse width adjusting section 32', the overlapping portions of the individual clock pulses are cut away by the leading edges of the succeeding clock pulses delayed by one phase relative to the preceding ones, so that clock pulses $c_0$ to $c_3$ having no overlapping portions relative to each other as shown in FIG. 11 appear on the output liens 117 to 120 respectively.

Due to the fact that the leading edges of the clock pulses $a_0'$ to $a_3'$ applied to the pulse width adusting section 32' have been adjusted to coincide with the phases $T_0$, $T_1$, $T_2$ and $T_3$ respectively, the pulse width of all of the clock pulses $c_0$ to $c_3$ appearing from the pulse width adjusting section 32' is adjusted to be $\frac{1}{4}$ T. Thus, the clock pulses $c_0$ to $c_3$ have a highly accurate pulse width.

Figure 12:
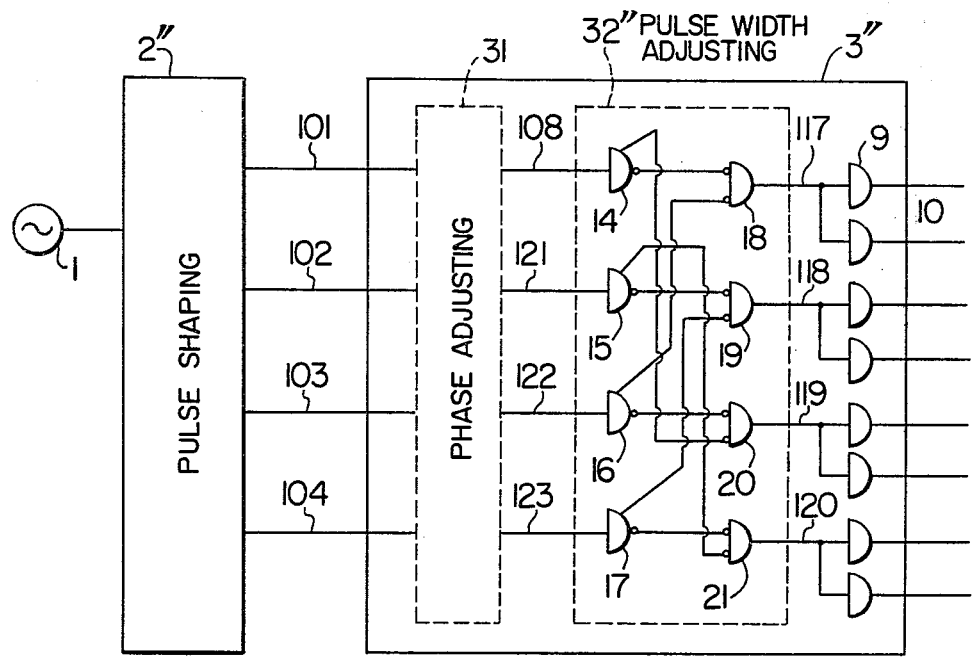
FIG. 12 is a block diagram of another embodiment of the pulse producing apparatus according to the present invention.

FIG. 12 is a block diagram of another embodiment of the clock pulse producing apparatus according to the present invention. This second embodiment is a modification of the first embodiment shown in FIG. 7 in that the structure of the apparatus is generally the same as that shown in FIG. 7 except its pulse width adjusting section 32''. The apparatus shown in FIG. 12 is adapted to produce such clock pulses that a preceding one of adjacent clock pulses has the second half of its pulse width overlapped by the first half of the pulse width of a succeeding one. The structure of the pulse width adjusting section 32'' in the apparatus shown in FIG. 12 is generally similar to that of the pulse width adjusting section 32' in the apparatus shown in FIG. 7, but the former differs from the latter in that the noninverted output from each of the gates 14 to 17 is applied to the NAND gate whose phase is delayed by two phases relative to the gate from which the input is applied.

Figure 13:
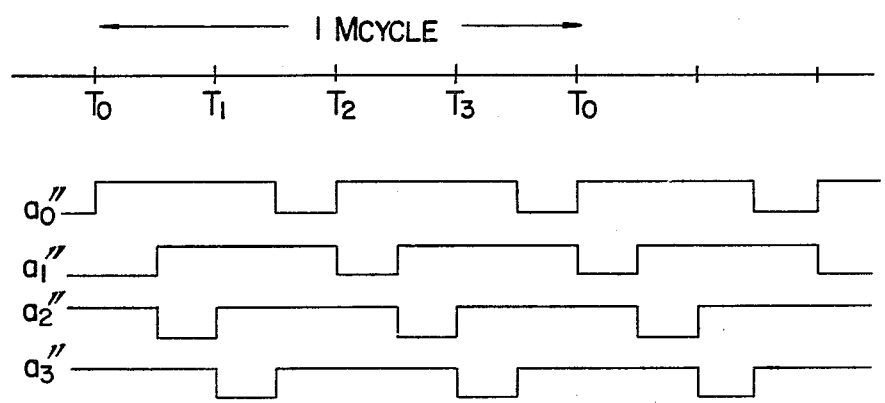
FIGS. 13 and 14 show waveforms of inputs to and outputs from the pulse width adjusting section in the apparatus shown in FIG. 12 respectively.

FIG. 13 shows waveforms of clock pulses $a_0''$ to $a_3''$ applied to the pulse width adjusting section 32'' by way of the respective input lines 108 to 123. It is supposed that these clock pulses $a_0''$ to $a_3''$ have been adjusted so that the phases of their leading edges are spaced apart by $\frac{1}{2}$ T relative to each other. A portion of each of the clock pulses $a_0''$ to $a_3''$ overlap, from the viewpoint of phase, with a leading edge portion of the clock pulse which is delayed by two phases relative to that of the former.

Figure 14:
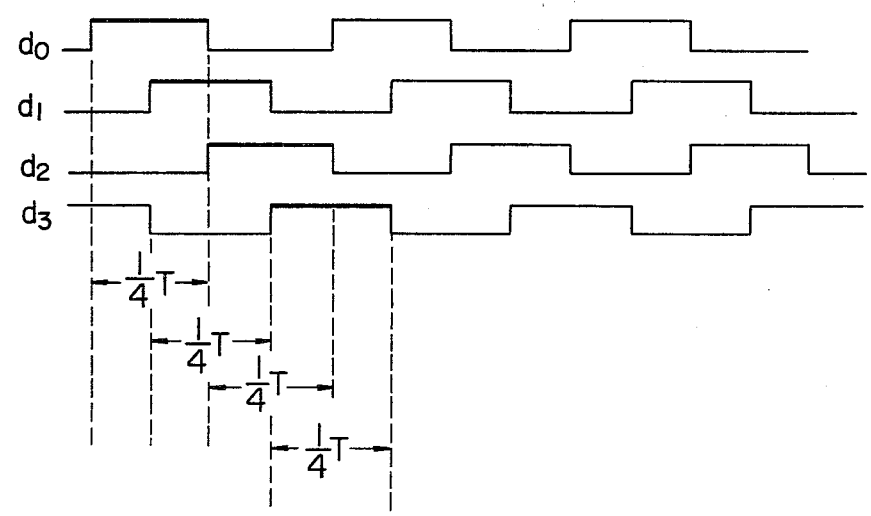

When the clock pulses $a_0''$ to $a_3''$ shown in FIG. 13 are applied to the pulse width adjusting section 32'', the overlapping portions of the individual clock pulses are cut away by the leading edge portions of the succeeding clock pulses delayed by two phases relative to the preceeding ones, so that clock pulses $d_0$ to $d_3$ as shown in FIG. 14 are obtained in which it will be seen that a preceding one of adjacent clock pulses has the second half of its pulse width overlapped by the first half of the pulse width of a secceeding one.

Due to the fact that the leading edges of the clock pulses $a_0''$ to $a_3''$ applied to the pulse width adjusting section 32'' have been adjusted to be spaced apart by $\frac{1}{8}$ T from each other, the pulse width of all of the clock pulses $d_0$ to $d_3$ appearing from the pulse width adjusting section 32'' is adjusted to be $\frac{1}{4}$ T. Thus, the clock pulses $d_0$ to $d_3$ have a highly accurate pulse width.

Although the pulse shaping unit 2'' for applying clock pulses such as those shown in FIG. 13 to the pulse width adjusting section 32'' has a structure different from that shown in FIG. 9, such a unit 2'' can be readily constructed by those skilled in the art. For example, this pulse shaping unit 2'' may be such that a group of clock pulses having a pulse width T and being spaced apart by $\frac{1}{8}$ T from each other may be produced on the basis of the oscillation output from the oscillator 1. Such a pulse shaping unit 2'' may be readily obtained by suitably modifying the structure shown in FIG. 9. Suppose that $CL_7$ and $CL_8$ are the output signals from the "1" and "0" output terminals respectively of the FF 43 shown in FIG. 9. Then, the signals $CL_3$, $CL_4$, $CL_7$ and $CL_8$ may be respectively applied to frequency dividing circuits similar to those described hereinbefore, and the clock pulses may be derived from these frequency dividing circuits. It is apparent that, in this modification, the signal deriving points of the frequency dividing circuits are the "1" output terminals of the FF's in the preceding stages.

According to the present invention described in detail hereinbefore, the pulse width adjusting circuits 7 required in the prior art apparatus shown in FIG. 4 are unnecessary, and, therefore, the step of regulating the pulse width adjusting circuits 7 in the manufacturing process for processors is entirely unnecessary.

The apparatus of the present invention shown in FIGS. 7 and 12 have been described, by way of example, with reference to the mode of cutting away a trailing edge portion of a preceding pulse of first phase by the leading edge of a pulse of second phase directly succeeding the preceding one or by the leading edge of a pulse of phase succeeding the preceding one after the pulse of second phase. However, the trailing edge portion of the preceding pulse of first phase may be cut away by the leading edge of a pulse of fourth phase succeeding the preceding one after the pulses of second phase and third phase. Also, a leading edge portion of a succeeding pulse may be cut away by the trailing edge of a pulse directly preceding the succeeding one, or by the trailing edge of a pulse preceding the succeeding one before two, three or more pulses.

It is apparent that such cut-away modes can be attained by suitably modifying the structure shown in FIG. 7 or 12. For example, the gates 14 to 17 may be kept in the illustrated positions, and the NAND gates 18 to 21 may be replaced by AND gates. The non-inverted output from each of the gates 14 to 17 may be applied to the AND gate of its own phase, and the inverted output from each of the gates may be applied to the AND gate of phase delayed by one, two or more phases relative to that of the gate.

Further, although clock pulses of positive polarity have been illustrated in FIGS. 7, 9 and 12 showing the apparatus according to the present invention, it is apparent that the clock pulses of negative polarity may also be used in the present invention.

Furthermore, although the present invention has been described as producing clock pulses of four phases as illustrated in FIGS. 7, 9 and 12, it is apparent that the present invention is also equally effectively applicable to an apparatus producing clock pulses of more phases.

We claim:

1. A pulse train producing apparatus comprising first means for generating a plurality of pulse trains different in phase from one another, the pulses in one train generated from said first means overlapping at respective trailing edge portions including the trailing edges thereof, respectively, with leading edge portions including the leading edges of the pulses in a different train, and second means receiving said pulse trains generated from said first means to cut away the overlapping trailing or leading edge portions of the respective pulses in each of said pulse trains, said second means including a binary output circuit provided for each of the pulse trains to generate a non-inverted output and an inverted output in response to each of the pulses thereof, and an AND circuit connected to said binary output circuit for making an AND operation on the non-inverted output appearing from said binary output circuit and the inverted output appearing from the binary output circuit provided for a different one of said pulse trains.

2. A pulse train producing apparatus as claimed in claim 1, wherein said first means generates said pulse trains in such a relation that the trailing edge portions of the clock pulses in one train overlap the leading edge portions of the pulses in another train adjacent in phase to said one train.

3. A pulse train producing apparatus as claimed in claim 1, wherein said first means generates said pulse trains in such a relation that the trailing edge portions of the pulses in one train overlap the leading edge portions of the pulses in another train adjacent but at least one in phase to said one train.

4. A pulse train producing apparatus as claimed in claim 1, wherein said AND circuit makes the AND operation on the outputs from the binary output circuits provided for two of said pulse trains adjacent in phase to each other.

5. A pulse train producing apparatus as claimed in claim 1, wherein said AND circuit makes the AND operation on the outputs from the binary output circuits provided for two of said pulse trains which are adjacent but at least one in phase to each other.

6. A pulse train producing apparatus comprising first means for generating a plurality of pulse trains different in phase from one another, the pulses in each of said trains overlapping at respective trailing edge portions including the trailing edges thereof, respectively, with leading edge portions including the leading edges of the pulses in a different one of said trains; second means for receiving said pulse trains generated by said first means and adjusting a phase-relationship between two pulse trains having said overlapping edge portions with respect to the phase of one of the leading and trailing edges of each pulse thereof, and third means for receiving the phase-adjusted pulse trains and removing only one of the leading and trailing overlapping edge portions of the pulses in each phase-adjusted pulse train; said third means including a binary output circuit provided for each of the pulse trains to generate a non-inverted output and an inverted output in response to each of the pulses thereof, and an AND circuit connected to said binary circuit for making an AND operation of the non-inverted output apparing from said binary output circuit and the inverted output appearing from the binary output circuit provided for a different one of said pulse trains.

7. A pulse train producing apparatus as claimed in claim 6, wherein said first means generates said pulse trains in such a relation that the trailing edge portions of the pulses in one train overlap the leading edge portions of the pulses in another train adjacent in phase to said one train.

8. A pulse train producing apparatus as claimed in claim 6, wherein said first means generates said pulse trains in such a relation that the trailing edge portions of the pulses in one train overlap the leading edge portions of the pulses in another train adjacent in phase to said one train.

9. A pulse train producing apparatus as claimed in claim 6, wherein said first means generates said pulse trains in such a relation that the trailing edge portions of the pulses in one train overlap the leading edge portions of the pulses in another train adjacent but delayed at least one phase relative to said one train.

10. A pulse train producing apparatus as claimed in claim 6, wherein said first means generates said pulse trains in such a relation that the trailing edge portions of the pulses in one train overlap the leading edge portions of the pulses in another train adjacent but delayed at least one phase to said one train.

11. A pulse train producing apparatus as claimed in claim 6, wherein said AND circuit makes the AND operation on the outputs from the binary output circuits provided for two of said pulse trains adjacent in phase to each other.

12. A pulse train producing apparatus as claimed in claim 6, wherein said AND circuit makes the AND operation on the outputs from the binary output circuits provided for two of said pulse trains which are adjacent but delayed at least one phase to each other.

13. A pulse train producing apparatus as claimed in any one of claims 6 through 12, wherein said second means adjusts the phase-relationship between the two pulse trains with respect to the phase of the leading edge of each pulse thereof.

14. A pulse train producing apparatus as claimed in any one of claims 6 through 12, wherein said second means adjusts the phase-relationship between the two pulse trains with respect to the phase of the trailing edge of each pulse thereof.

* * * * *